US007203609B2

(12) United States Patent
Moritani

(10) Patent No.: US 7,203,609 B2
(45) Date of Patent: Apr. 10, 2007

(54) MAGNETIC FIELD GENERATING APPARATUS AND MAGNETIC FIELD CONTROLLING METHOD

(75) Inventor: Nakanobu Moritani, Chiba (JP)

(73) Assignee: Seiko Precision Inc., Chiba (JP)

( * ) Notice: Subject to any disclaimer, the term of this patent is extended or adjusted under 35 U.S.C. 154(b) by 0 days.

(21) Appl. No.: 11/096,723

(22) Filed: Mar. 31, 2005

(65) Prior Publication Data

US 2006/0089815 A1 Apr. 27, 2006

(30) Foreign Application Priority Data

Oct. 27, 2004 (JP) ............................. 2004-311747

(51) Int. Cl.
*G01R 25/00* (2006.01)
*H01H 47/00* (2006.01)

(52) U.S. Cl. ........................................ 702/65; 361/155

(58) Field of Classification Search .................. 702/65, 702/85; 324/207.15, 207.23, 236, 260; 368/159, 368/162, 155; 327/129; 361/152, 155, 156; 336/205

See application file for complete search history.

(56) References Cited

U.S. PATENT DOCUMENTS 4,300,183 A * 11/1981 Richardson ................. 361/152
4,328,525 A * 5/1982 Allen et al. ................. 361/152
6,720,771 B2 * 4/2004 Gupta et al. ................ 324/339
7,005,935 B2 * 2/2006 Moore ........................ 331/166

FOREIGN PATENT DOCUMENTS

JP 08-221627 A 8/1996
JP 08221628 A * 8/1996

* cited by examiner

*Primary Examiner*—John Barlow
*Assistant Examiner*—Toan M. Le
(74) *Attorney, Agent, or Firm*—Townsend and Townsend and Crew LLP

(57) ABSTRACT

When a sine wave is supplied from a sine wave oscillator through a resonant capacitor selection circuit, an alternating electric and magnetic field is generated on a loop coil. A magnetic intensity detection coil supplies an electromagnetic field signal to a control circuit when detecting electromagnetic intensity of the loop coil. The control circuit controls the resonant capacitor selection circuit based on the electromagnetic field signal and adjusts a maximum current to flow into the loop coil. Namely, a resonant capacitor with a suitable capacitance is selected in such a way that a resonance point (for example, 125 kHz) reaches a maximum level. Moreover, the control circuit adjusts a variable resistor to obtain a target electromagnetic field signal (intensity of electromagnetic field) in this state. Namely, automatic gain control is performed to obtain optimal electromagnetic field intensity on the loop coil.

11 Claims, 12 Drawing Sheets

MAGNETIC FIELD GENERATING APPARATUS AND MAGNETIC FIELD CONTROLLING METHOD

BACKGROUND OF THE INVENTION

1. Field of the Invention

The present invention relates to a magnetic field generating apparatus used in a predetermined athletic time measuring system, and particularly to a magnetic field generating apparatus and magnetic field controlling method that can suitably control an electromagnetic field to be generated.

2. Description of the Related Art

At the marathon races and the like, attempts at measuring each runner's finish time have recently been made. For example, the following time measuring system is put to practical use. Specifically, a barcode is printed on a runner's number cloth and each runner's finish time is measured based on time obtained when the barcode of the runner, who has crossed the finish line, is read by a reader.

However, in such a time measuring system, since barcode reading is executed for a predetermined time after the runner crosses the finish line, a finish time, which is delayed as compared with an actual measurement, is measured. Particularly, when many runners cross the finish line at the same time, waiting time for reading the barcode is caused. This causes a problem in which their finish time, which is considerably delayed as compared with an actual measurement, is measured.

Moreover, there grows a need to measure running time including not only the finish time but also an elapsed time for each split point. However, the conventional time measuring system cannot meet such a need.

In order to solve such a problem, various kinds of time measuring systems are developed and operational tests for practical use are tried. In the new time measuring systems, a mainstream method is that each runner's running time is measured in a non-contact manner in order to measure the finish time closer to the actual measurement and enable to measure the elapsed time for each split point.

For example, there is proposed a time measuring system in which a small-sized timer device is held by each runner and running time is automatically measured by the timer device when the runner reaches a time measuring point (each split point and a finish point). In such a time measuring system, for example, an electromagnetic field is generated at a time measuring point and the electromagnetic field is detected by use of an electromagnetic induction coil included in the timer device, thereby determining the arrival to the time measuring point.

For example, Unexamined Japanese Patent Application KOKAI Publication No. H8-221627 discloses a time measuring system explained below. Namely in the time measuring system, two loop coils are arranged in parallel to sandwich a finish line on a marathon running course. Current is supplied to each loop coil from an AC power supply with a different output frequency to generate an electromagnetic field. Then, the electromagnetic induction coil detects the electromagnetic field on the first loop coil (front side seen from the runner) to obtain the frequency in accordance with the arrival of the runner to the finish point. Sequentially, the electromagnetic induction coil captures the electromagnetic field on the second loop coil to detect a change in the frequency. Then, a position where the change in the frequency is detected corresponds to the finish line. The timer device measures the running time with timing when the change in the frequency is detected.

The aforementioned document discloses the technique in which the current is supplied to the loop coils from the AC power supply to generate the electromagnetic field. However, it is difficult to say that sufficient structural components as an apparatus that generates the electromagnetic field are explained in the description.

Generally, a resonant capacitor, an ammeter and the like are required for the magnetic field generating apparatus that generates the electromagnetic field in addition to the aforementioned AC power supply and the loop coils. Namely, in the aforementioned document, the structural components necessary for the magnetic field generating apparatus and sufficient explanation thereof are omitted.

The following will explain the general magnetic field generating apparatus with reference to FIG. 8A and FIG. 8B. FIGS. 8A and 8B are schematic views each explaining the structure of the conventional magnetic field generating apparatus.

A magnetic field generating apparatus illustrated in FIG. 8A includes an AC power supply 101 having an amplifier, a fixed resonant capacitor 102, and a loop coil 103.

A value (capacitance) of the resonant capacitor 102 is set by a skilled operator before the start of the race so that the magnetic field generating apparatus is adjusted in such a way to generate a suitable electromagnetic field on the loop coil 103. In other words, a condition of a location where the loop coil 103 is mounted, a size of the loop coil 103, the number of turns thereof, a length of a lead portion L and the like are taken into consideration to set the value of the resonant capacitor 102.

While, a magnetic field generating apparatus illustrated in FIG. 8B includes an AC power supply 101, multiple resonant capacitors 102, a loop coil 103, a selection switch 104, and an ammeter 105.

The magnetic field generating apparatus can select the resonant capacitor 102 with an arbitrary capacitance by a manual operation of the selection switch 104. Namely, the operator suitably selects any resonant capacitor 102 as checking a current value flowing into the loop coil 103 by use of the ammeter 105 so that an adjustment is made to generate an appropriate electromagnetic field on the loop coil 103.

For this reason, the electromagnetic field on the loop coil 103 can be easily adjusted to a certain degree by even an operator who is not skilled.

However, when such a magnetic field generating apparatus is actually used, load conditions (deformation of the loop coil 103, extension of the lead portion L, environmental conditions (water, humidity, etc.)) at the location where the loop coil 103 is mounted are changed halfway in many cases. Moreover, it is known that a resonance point (series resonating frequency formed by the resonant capacitor 102 and the loop coil 103) is easily varied, depending on the characteristic of the loop coil 103.

In this way, when the load conditions are changed halfway to fail in satisfying an optimal driving condition, it is substantially impossible for the magnetic field generating apparatus illustrated in FIG. 8A to readjust the electromagnetic field on the loop coil 103.

While, the magnetic field generating apparatus illustrated in FIG. 8B can readjust the electromagnetic field even when the load conditions are changed. However, the operator must always monitor the ammeter 105 and appropriately operate the selection switch 104 during the race. Accordingly, extremely complicated operations are required to maintain the electromagnetic field in a suitable state. Furthermore, when much time is taken to operate the selection switch 104, the electromagnetic field on the loop coil 103 is in an unsuitable state (state that a suitable electromagnetic field is not generated), so that the electromagnetic field cannot be detected by the timer device (electromagnetic induction coil).

SUMMARY OF THE INVENTION

In view of the aforementioned circumstances, an object of the present invention is to provide a magnetic field generating apparatus and magnetic field controlling method that can suitably control an electromagnetic field to be generated.

In order to attain the above object, a magnetic field generating apparatus according to a first aspect of the present invention includes a loop coil provided on a running course. The magnetic field generating apparatus further includes a resonant capacitor, having a variable capacitance, connected to the loop coil. The magnetic field generating apparatus further includes a capacitance changing section that changes the capacitance of the resonant capacitor. The magnetic field generating apparatus further includes a sine wave supplying section that supplies a sine wave current with a predetermined frequency to the loop coil through the resonant capacitor. The magnetic field generating apparatus further includes an intensity detecting section that detects intensity of an electromagnetic field excited by the loop coil in a state that the sine wave current is supplied by the sine wave supplying section. The magnetic field generating apparatus further includes a control section that controls the capacitance changing section based on the intensity of the electromagnetic field detected by the intensity detecting section to change the capacitance of the resonant capacitor.

According to the present invention, the loop coil is formed in the shape substantially a figure eight loop coil provided on a running course. Moreover, the capacitance changing section changes the capacitance of the resonant capacitor with a variable capacitance connected to the loop coil. The sine wave supplying section supplies the sine wave current with a predetermined frequency to the loop coil through the resonant capacitor. The intensity detecting section detects intensity of the electromagnetic field excited by the loop coil in a state that the sine wave current is supplied by the sine wave supplying section. The control section controls the capacitance changing section based on intensity of the electromagnetic field detected by the intensity detecting section to change the capacitance of the resonant capacitor.

As a result, it is possible to control the electromagnetic field to be generated.

The magnetic field generating apparatus may further include an amplifying section that amplifies the sine wave current supplied from the sine wave supplying section by an arbitrary gain and supplies the amplified sine wave current to the loop coil through the resonant capacitor.

The control section may control the gain of the amplifying section in such a way to obtain an electromagnetic field with predetermined intensity on the loop coil in a state that the capacitance changing section is controlled so that a maximum current flows into the loop coil.

The resonant capacitor may include multiple capacitors connectable in series to two input terminals of the loop coil, respectively.

The capacitance changing section may select one or more capacitors connected to the loop coil from the multiple capacitors.

The resonant capacitor may include a variable capacitance capacitor that changes the capacitance by a mechanical operation.

The capacitance changing section may include an actuator that provides the mechanical operation to the variable capacitance capacitor based on control by the control section.

The resonant capacitor may include a variable capacitance diode.

The capacitance changing section may include a DC voltage supplying section that supplies a DC voltage, which defines a capacitance value of the variable capacitance diode.

The loop coil may be formed in the shape substantially a figure eight and excite an electromagnetic field with a predetermined intensity distribution on the loop coil according to the shape when the sine wave current is supplied.

The loop coil may be square formed and excite an electromagnetic field with a predetermined intensity distribution on the loop coil according to the shape when the sine wave current is supplied.

The loop coil may include two square formed loop coils and excite an electromagnetic field with a predetermined intensity distribution on each loop coil according to the shape when the sine wave current is supplied.

The intensity detecting section may detect intensity of an electromagnetic field excited by the loop coil by a magnetic field detection coil placed on the same plane of the inner side of the loop coil.

The intensity detecting section may detect intensity of an electromagnetic field excited by the loop coil by measuring a potential difference between both ends of a resistor placed to connect the amplifying section to the capacitance changing section.

In order to attain the above object, a magnetic field controlling method according to a second aspect of the present invention controls an electromagnetic field generated on a loop coil placed on a running course.

The magnetic field controlling method comprises a capacitance changing step of changing a capacitance of a resonant capacitor when a sine wave current with a predetermined frequency is supplied to the loop coil through the resonant capacitor with a variable capacitance from a sine wave oscillator. The magnetic field controlling method further comprises an intensity detecting step of detecting intensity of an electromagnetic field excited by the loop coil in a state that the sine wave current is supplied through the resonant capacitor. The magnetic field controlling method further comprises a controlling step of controlling the capacitance changing step based on intensity of the electromagnetic field detected in the intensity detecting step to change the capacitance of the resonant capacitor.

According to the present invention, the capacitance changing step changes the capacitance of the resonant capacitor at the time of supplying the sine wave current with a predetermined frequency to the loop coil from the sine wave oscillator through the resonant capacitor with a variable capacitance. Moreover, the intensity detecting step detects intensity of the electromagnetic field excited by the loop coil in a state that the sine wave current is supplied through the resonant capacitor. Then, the controlling step controls the capacitance changing step based on intensity of the electromagnetic field detected by the intensity detecting step to change the capacitance of the resonant capacitor.

As a result, it is possible to control the electromagnetic field to be generated.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

The following will explain a magnetic field generating apparatus according to embodiments of the present invention with reference to the drawings.

First Embodiment

Figure 1:
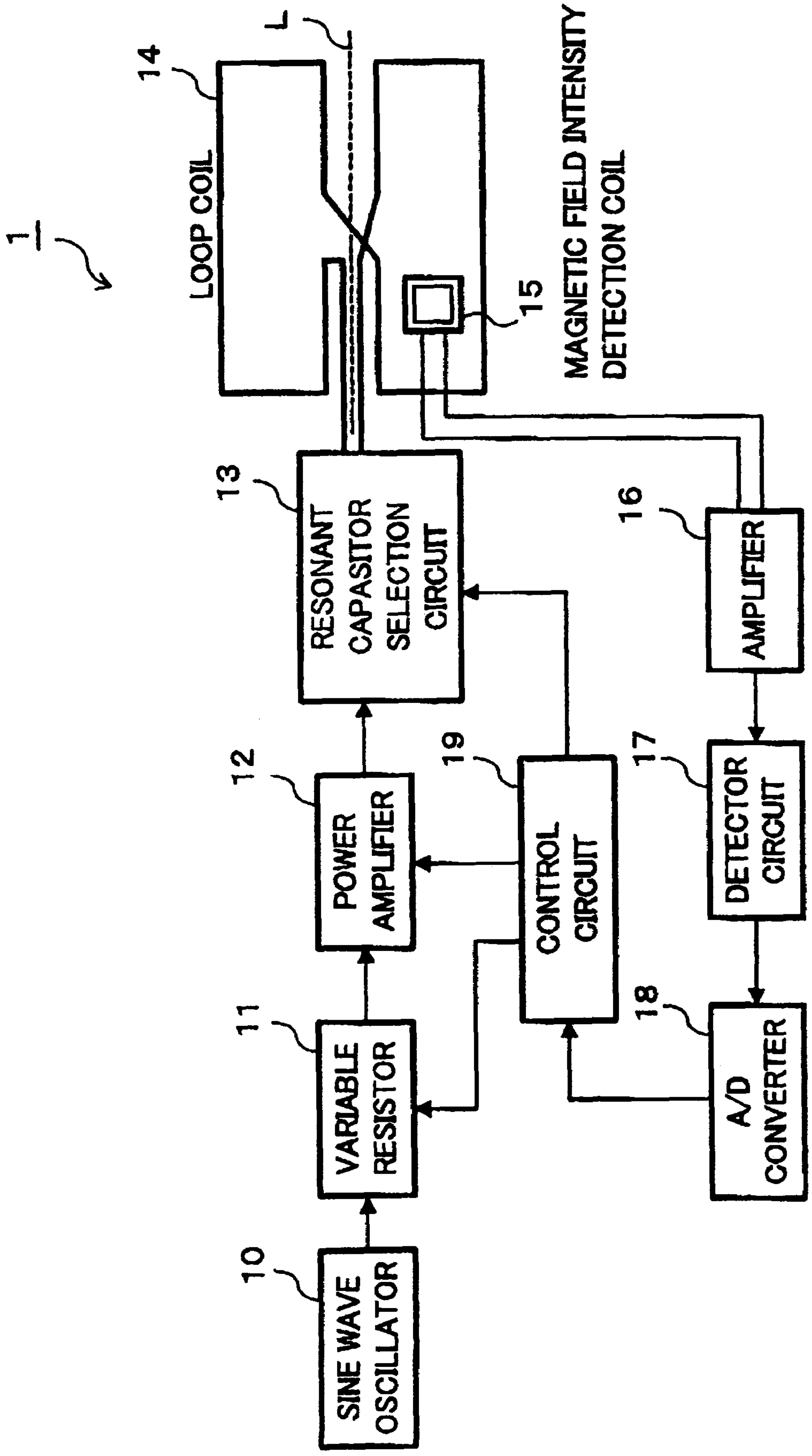
FIG. 1 is a schematic view illustrating one example of a structure of a magnetic field generating apparatus according to a first embodiment of the present invention.

FIG. 1 illustrates one example of a structure of a magnetic field generating apparatus 1 according to a first embodiment of the present invention. The magnetic field generating apparatus 1 is used in, for example, an athletic time measuring system that measures running time of each runner in a marathon race. Namely, the magnetic field generating apparatus 1 generates an electromagnetic field at time measuring points including a time measuring line L. A magnetic field detection coil, which is included in a wireless IC tag (small-sized radio communication equipment with a timer) held by the runner, detects the electromagnetic field generated by the magnetic field generating apparatus 1, thereby detecting arrival to the time measuring line L.

As illustrated in FIG. 1, the magnetic field generating apparatus 1 includes a sine wave oscillator 10 as a sine wave supplying section, a variable resistor 11, a power amplifier 12 as an amplifying section, a resonant capacitor selection circuit 13 as a capacitance changing section, a loop coil 14, a magnetic field intensity detection coil 15 as an intensity detecting section, an amplifier 16, a detector circuit 17, an A/D converter 18, and a control circuit 19 as a control section.

The sine wave oscillator 10 includes a crystal oscillator, and generates a sine wave (sine wave current) synchronized with a frequency of the crystal oscillator. The sine wave oscillator 10 generates a sine wave whose frequency is, for example, 125 kHz, and supplies the generated sine wave to the power amplifier 12.

The variable resistor 11 includes a resistor whose resistance value is changeable and changes a gain of the power amplifier 12.

The power amplifier 12 amplifies the sine wave (sine wave current) supplied from the sine wave oscillator 10 and supplies the amplified sine wave to the loop coil 14 through the resonant capacitor selection circuit 13. More specifically, the gain is controlled by the control circuit 19 and the power amplifier 12 power-amplifies the sine wave up to a level at which the loop coil 14 can be sufficiently driven. Namely, the gain is changed according to the resistance value of the variable resistor 11 controlled by the control circuit 19. The sine wave that is power amplified according to the gain is supplied to the loop coil 14 through the resonant capacitor selection circuit 13.

The resonant capacitor selection circuit 13 includes multiple capacitors that are connectable in series to correspond to two input terminals of the loop coil 14.

Figure 2:
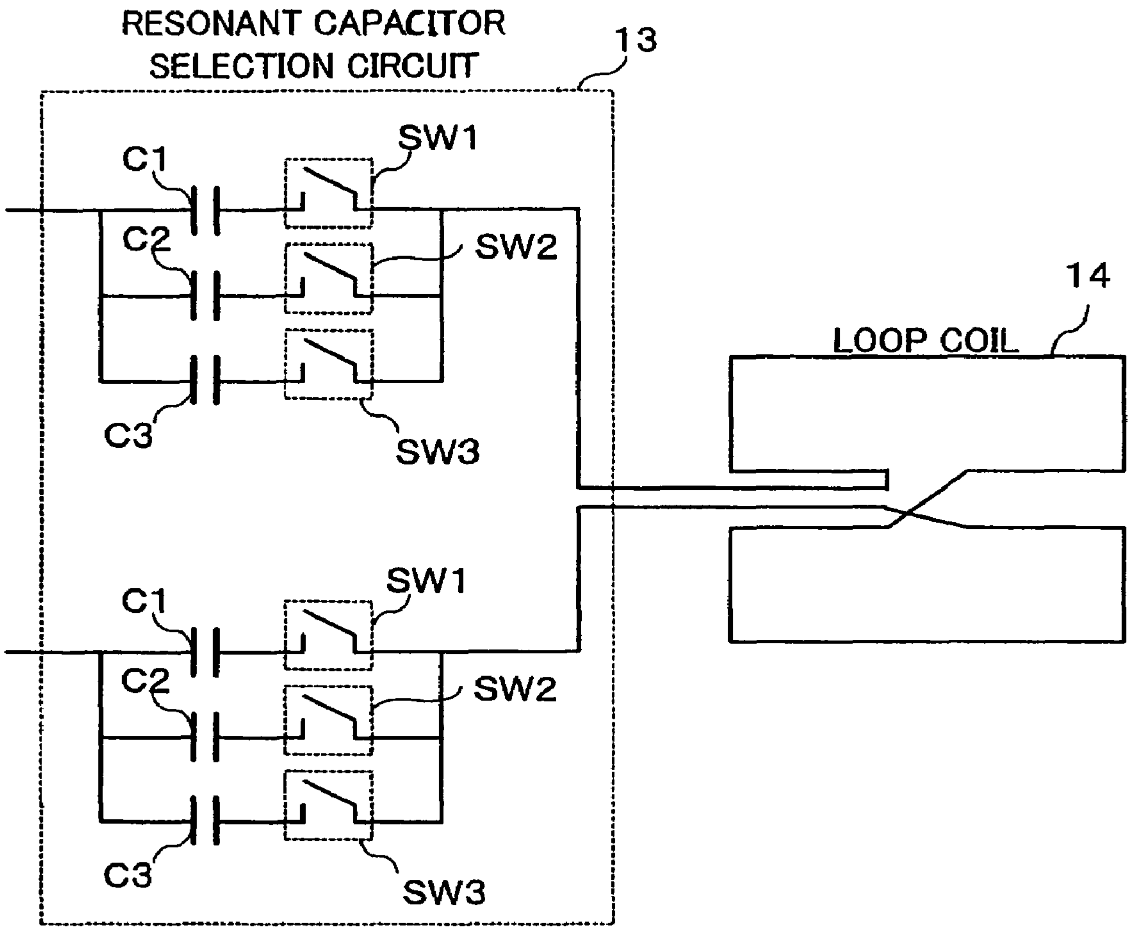
FIG. 2 is a schematic view illustrating one example of a resonant capacitor selection circuit.

For example, as illustrated in FIG. 2, the resonant capacitor selection circuit 13 includes multiple capacitors C1 to C3 and control switches SW1 to SW3 corresponding to the respective capacitors C (C1 to C3), and is connected to each input terminal of the loop coil 14.

Each capacitor C has a predetermined capacitance (for example, different capacitance) that is defined. Each capacitor C is connected in series to the loop coil 14 when the corresponding control switch SW is turned on. In addition, when the multiple control switches SW are turned on, the corresponding capacitors C are combined in parallel and connected in series to the loop coil 14 as a resonant capacitor with added capacitances.

Moreover, the respective control switches SW1 to SW3 are turned on/off by the control circuit 19.

Additionally, though FIG. 2 shows three capacitors C to correspond to the respective input terminals, the number of capacitors is not limited to 3 and any number of capacitors may be used. For example, in order to improve resolution by combinations of the capacitors C, the number of capacitors may be increased as required.

The above-structured resonant capacitor selection circuit 13 selects a resonant capacitor (single capacitor C or multiple capacitors C) with a suitable capacitance under control of the control circuit 19 in such a way that a resonance point (series resonating frequency) at the loop coil 14 reaches a predetermined value (for example, 125 kHz). Additionally, since the respective control switches SW are turned on/off in the same manner to correspond to both ends of the loop coil 14, the resonant capacitor with the same capacitance is connected in series to each of the input terminals of the loop coil 14.

Referring back to FIG. 1, the loop coil 14 is a coil that is formed in the shape of substantially "a figure eight", and is suitably provided on a running course where the runner runs.

Figure 3A:
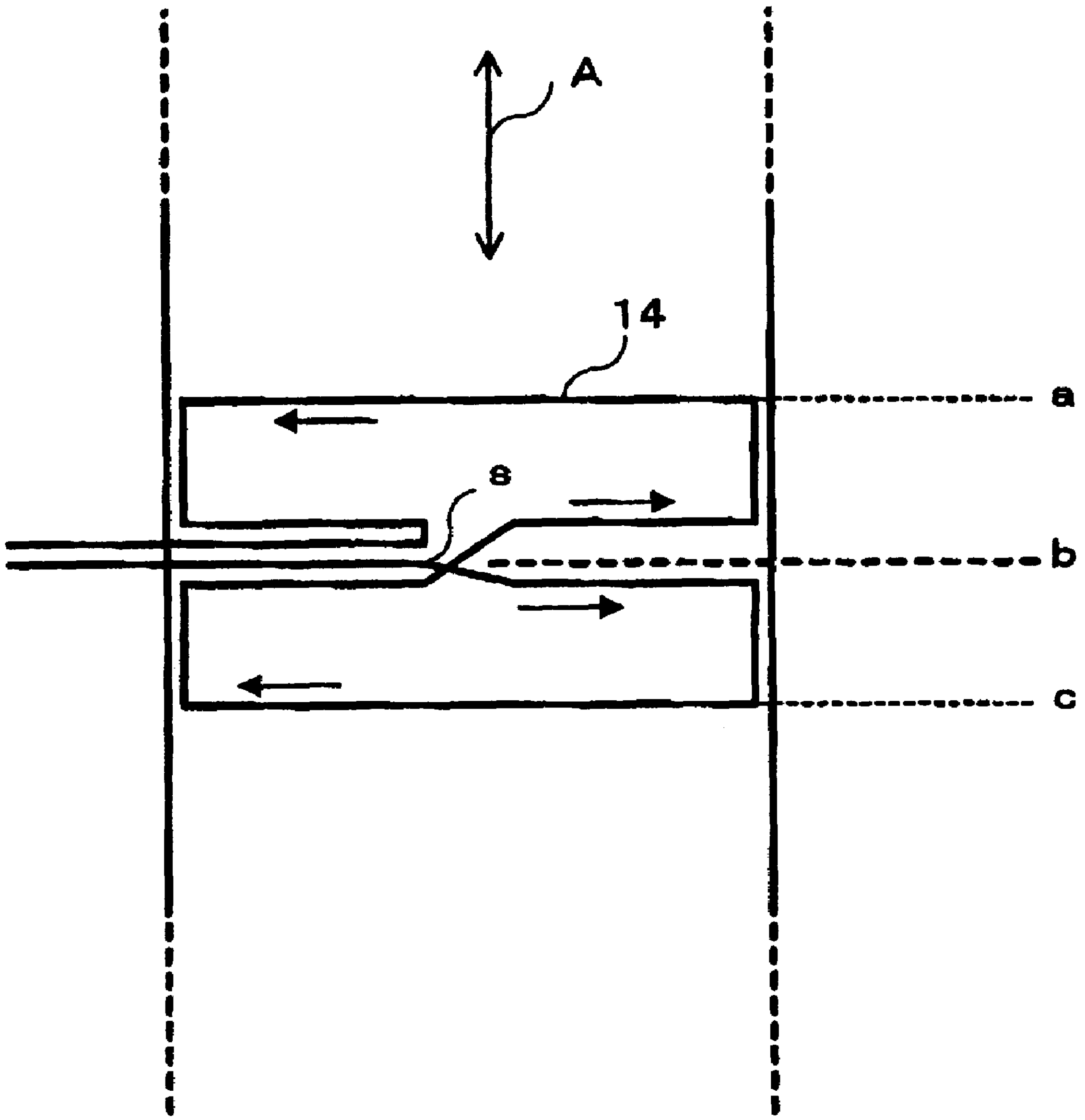
FIG. 3A is a schematic view illustrating one example of a loop coil provided on a running course.

For example, as illustrated in FIG. 3A, the loop coil 14 is formed in the shape of a figure "8" where two rectangular (square) coil portions are put together in the direction where the runner runs (direction of an arrow A in FIG. 3A). More specifically, the loop coil 14 is wound in a forward direction of the "8" figure shape to have a center (mid-point) of the eight figure shape, namely, a feeding point s at a crossing section. A straight line b, which extends in a direction perpendicular to the direction where the runner runs through the feeding point s, is used as a central line, and upper and lower portions of the eight figure shape are formed along straight lines a and b that are separated substantially in parallel by a predetermined distance. In addition, the loop 14 is provided to be placed on the time measuring line L where the straight line b is a measuring point.

Figure 3B:
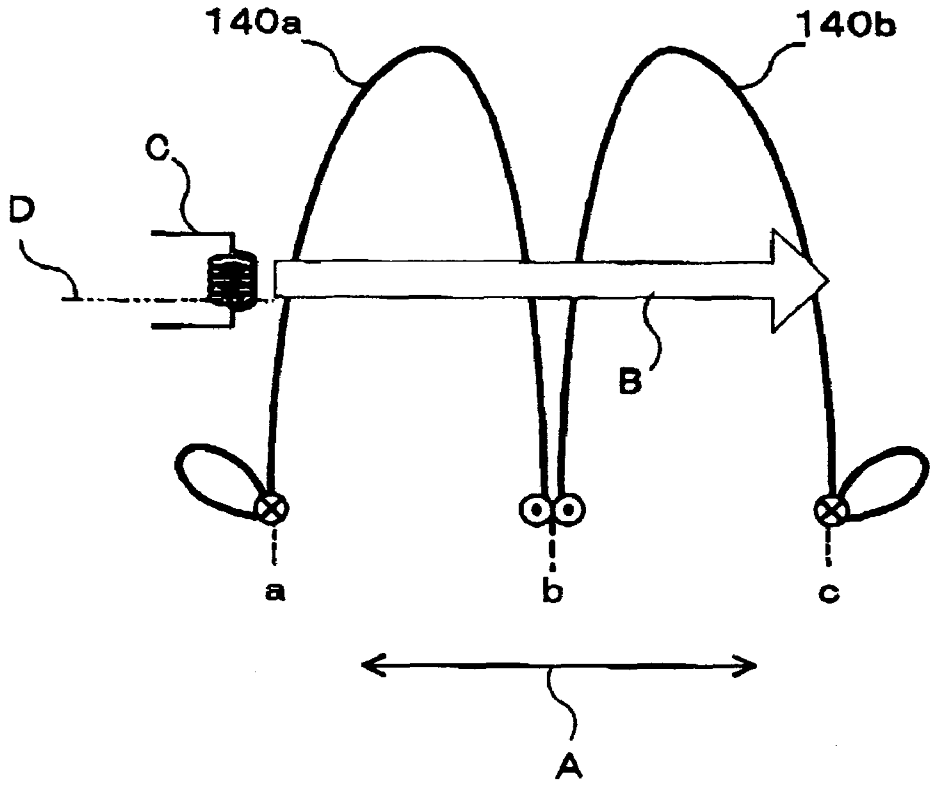
FIG. 3B is a schematic view explaining an electromagnetic field to be generated.

The loop coil 14 is formed in such a way that current flows in the arrow direction from the feeding point s of FIG. 3A. When a sine wave is supplied through the resonant capacitor selection circuit 13, the loop coil 14 generates an alternating electric and magnetic field on the coil. Specifically, as illustrated in FIG. 3B, the loop coil 14 generates a first electromagnetic field 140*a* on one coil portion and a second electromagnetic field 140*b* on the other coil portion. The second electromagnetic field 140*b* is adjacent to the direction where the runner runs (direction of an arrow A) with respect to the first electromagnetic field 140*a* and cancels magnetism with the first electromagnetic field 140*a*.

Additionally, as mentioned above, since the resonant capacitor selection circuit 13 connects the resonant capacitors with the same capacitance to both input terminals of the loop coil 14 in series, the first electromagnetic field 140*a* and the second electromagnetic field 140*b* have equal electromagnetic field intensity.

Figure 3C:
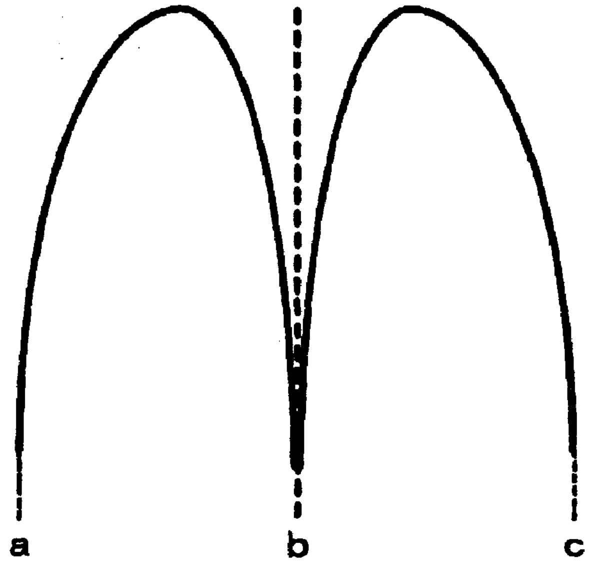
FIG. 3C is a schematic view explaining an intensity distribution of an electromagnetic field to be generated.

In such the electromagnetic field, an electromagnetic field detection coil C where a detection coil surface D shown in FIG. 3B is placed in parallel with a running course surface (namely, a detecting direction is vertical to the running course surface) is moved in a direction of an arrow B, an electromagnetic field intensity distribution as illustrated in FIG. 3C can be obtained. Namely, electromagnetic field intensity of the electromagnetic field on the straight line b becomes extremely smaller than electromagnetic field intensity of both sides (for example, electromagnetic field intensity reaches "0") by cancellation of magnetism of the electromagnetic field performed by the first electromagnetic field 140*a* and the second electromagnetic field 140*b*.

Accordingly, when the runner, who holds the magnetic field detection coil C, passes through the loop coil 14 along the direction of the arrow B, the magnetic field detection coil C can detect the time measuring line L (straight line b) as an inflection point of the electromagnetic field between the first electromagnetic field 140*a* and the second electromagnetic field 140*b*.

Referring back to FIG. 1, the magnetic field intensity detection coil 15 is placed at an inner side of the loop coil 14 and is on the same plane as the loop coil 14 (namely, on the running course), and detects intensity of the electromagnetic field generated by the loop coil 14.

More specifically, the magnetic field intensity detection coil 15 detects intensity of the electromagnetic field excited by the loop coil 14 and obtains an electromagnetic field signal that is proportional to the intensity, and supplies the obtained signal to the amplifier 16.

The amplifier 16 amplifies the electromagnetic field signal supplied from the magnetic field intensity detection coil 15 up to a signal level that the control circuit 19 can perform processing.

The detector circuit 17 rectifies the electromagnetic field signal (alternating electric and magnetic field signal) amplified by the amplifier 16, and converts the rectified signal to a DC signal.

The A/D (Analog/Digital) converter 18 converts the DC signal (analog signal) rectified by the detector circuit 17 to a digital signal that can be processed by the control circuit 19.

The control circuit 19 includes a CPU (Central Processing Unit) and the like and controls the entire magnetic field generating apparatus 1.

For example, the control circuit 19 suitably controls the variable resistor 11, the power amplifier 12 and the resonant capacitor selection circuit 13, and generates a suitable electromagnetic field on the loop coil 14.

Specifically, the control circuit 19 obtains the electromagnetic field signal (intensity signal of electromagnetic field) detected by the magnetic field intensity detection coil 15 through the A/D converter 18 in a state that the electromagnetic field is generated on the loop coil 14. Then, the control circuit 19 controls the resonant capacitor selection circuit 13 based on the obtained electromagnetic field signal, and adjusts a maximum current to flow into the loop coil 14. In other words, the control circuit 19 on/off-controls the respective control switches SW of the resonant capacitor selection circuit 13 and selects a resonant capacitor with a suitable capacitance in such a way that the resonance point (for example, 125 kHz) reaches a maximum level.

Furthermore, the control circuit 19 adjusts the variable resistor 11 (the gain of the power amplifier 12) in such a way to obtain a target electromagnetic field signal (intensity of electromagnetic field) in a state that the resonant capacitor selection circuit 13 is controlled to make the maximum current flow into the loop coil 14. Namely, the control circuit 19 performs automatic gain control in order to obtain optimal electromagnetic field intensity on the loop coil 14.

Figure 4:
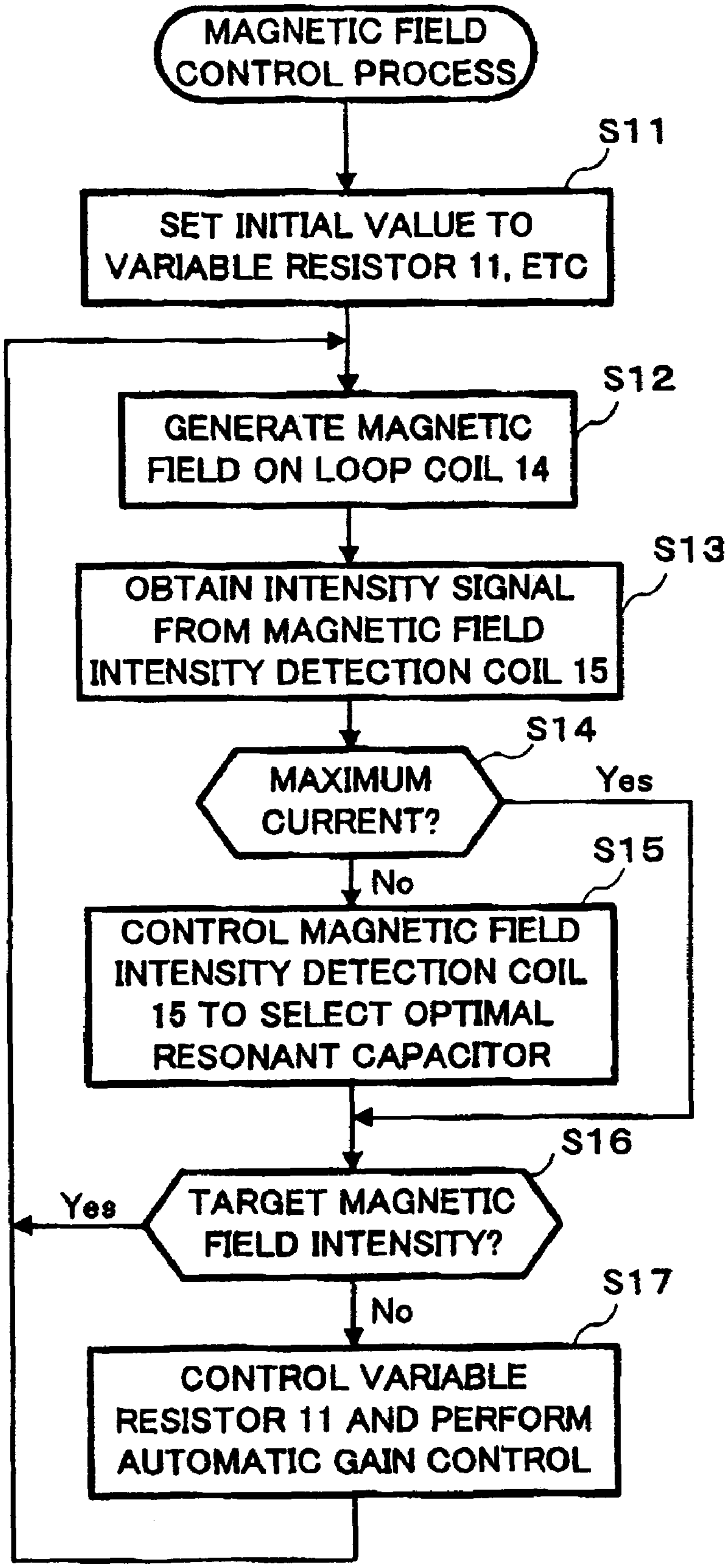
FIG. 4 is a flowchart explaining a magnetic field control process according to an embodiment of the present invention.

The following will explain an operation of the above-structured magnetic generating apparatus 1 with reference to FIG. 4. FIG. 4 is a flowchart explaining magnetic field control process executed by the control circuit 19.

First of all, the control circuit 19 sets an initial value to the variable resistor 11 and the like (step S11). Namely, the control circuit 19 sets a predetermined initial value to the variable resistor 11, and selects a capacitance preset by the resonant capacitor selection circuit 13.

Then, the control circuit 19 generates an electromagnetic field on the loop coil 14 (step S12). Namely, the control circuit 19 supplies the power-amplified sine wave to the loop coil 14 placed on the running course through the resonant capacitor selection circuit 13, and generates the electromagnetic field on the loop coil 14.

The magnetic field intensity detection coil 15 detects intensity of the electromagnetic field excited by the loop coil 14, and generates an electromagnetic field signal (intensity signal of the electromagnetic field) that is proportional to the intensity.

Then, the control circuit 19 obtains the electromagnetic field signal generated by the magnetic field intensity detection coil 15 through the A/D converter 18 (step S13).

The control circuit 19 determines whether the maximum current flows into the loop coil 14 or not based on the obtained electromagnetic field signal (step S14).

When the control circuit 19 determines that the maximum current flows (step S14; Yes), process goes to step S16 to be described later.

While, when determining that no maximum current flows (step S14; No), the control circuit 19 controls the magnetic field intensity detection coil 15 to select an optimal resonant capacitor (step S15). Namely, the control circuit 19 controls the resonant capacitor selection circuit 13 to adjust the maximum current to flow into the loop coil 14 based on the obtained electromagnetic signal.

Sequentially, the control circuit 19 determines whether the electromagnetic field reaches target intensity (step S16).

When the control circuit 19 determines that the electromagnetic field reaches target intensity (step S16; Yes), process is returned to the aforementioned step S12.

While, when the control circuit 19 does not determine that the electromagnetic field reaches target intensity (step S16; No), the control circuit 19 controls the variable resistor 11 to perform automatic gain control (step S17). Namely, the control circuit 19 adjusts the variable resistor 11 (the gain of the power amplifier 12) in such a way to obtain target electromagnetic field intensity on the loop coil 14. Then, the control circuits returns process to the aforementioned step S12.

By the aforementioned magnetic control process, the magnetic generating apparatus 1 can generate the electromagnetic field with suitable intensity on the loop coil 14 for a relatively short period of time after mounting the loop coil 14. Thereafter, when load conditions at the location where the loop coil 14 is mounted are changed halfway or even when the resonance point is varied by the characteristic of the loop coil 14, the resonant capacitor selection circuit 13 and the variable resistor 11 are automatically adjusted, so that the electromagnetic field generated by the loop coil 14 is suitably maintained.

As a result, the magnetic field generating apparatus 1 of the present invention can suitably control the electromagnetic field to be generated.

The aforementioned fist embodiment has explained the case in which the loop coil 14, which is formed in the shape of substantially a figure "8", is used to generate the electromagnetic field on the loop coil 14. However, the shape of the loop coil is not limited to the shape of a figure "8". The shape may be square (rectangular) and the like.

Figure 9:
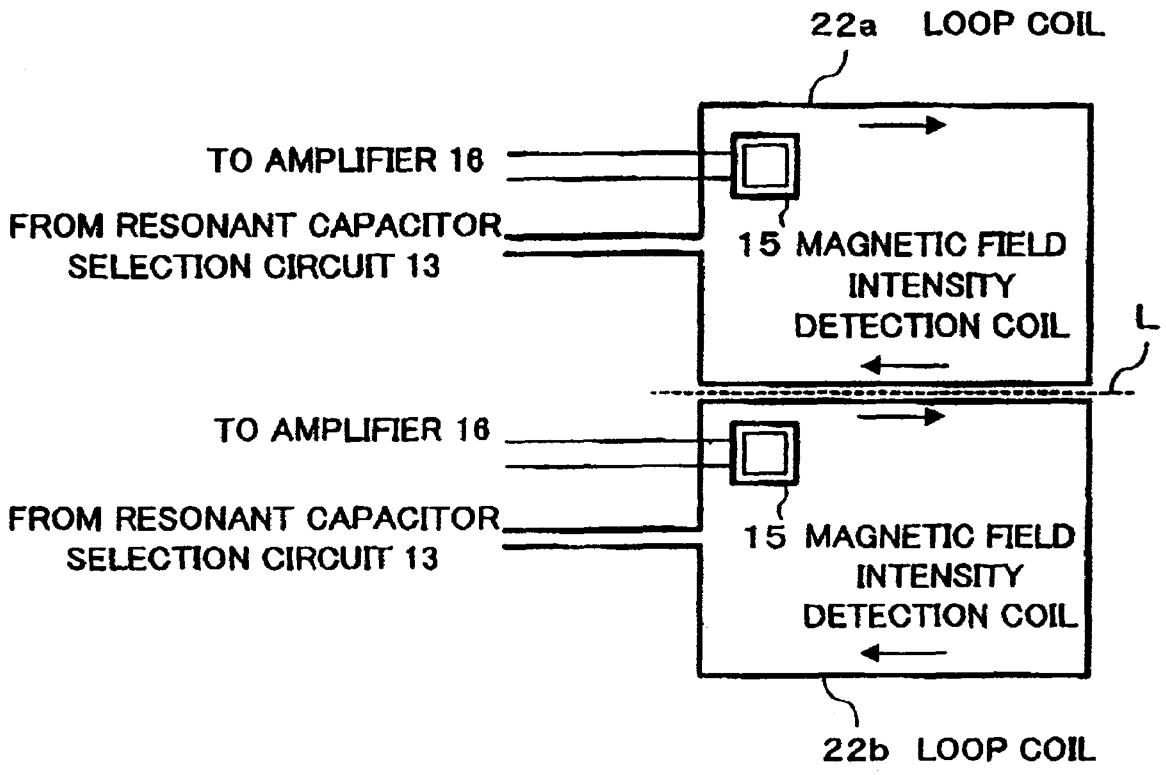
FIG. 9 is a schematic view illustrating one example of a loop coil provided on a running course.

For example, as illustrated in FIG. 9, two independent square (rectangular) loop coils 22*a* and 22*b* are put together in the direction where the runner runs, thereby making it possible to generate the same electromagnetic field as that of the first embodiment. More specifically, current is made to flow into each of the loop coils 22*a* and 22*b* in the direction of the arrow, thereby making it possible to generate the same electromagnetic field as that of the loop coil 14, which is formed in the shape of substantially a figure "8", by use of two loop coils. According to this structure, a straight line with which the loop coil 22*a* and the loop coil 22*b* come in contact is used as the time measuring line L. Moreover, according to this structure, the electromagnetic fields generated by the loop coil 22*a* and 22*b* are independently controlled to have predetermined intensity, thereby making it possible to suitably control the electromagnetic field to be generated.

Furthermore, as described later, the structure using one square loop coil makes it possible to implement the magnetic generating apparatus and magnetic field controlling method of the present invention.

Second Embodiment

Figure 5:
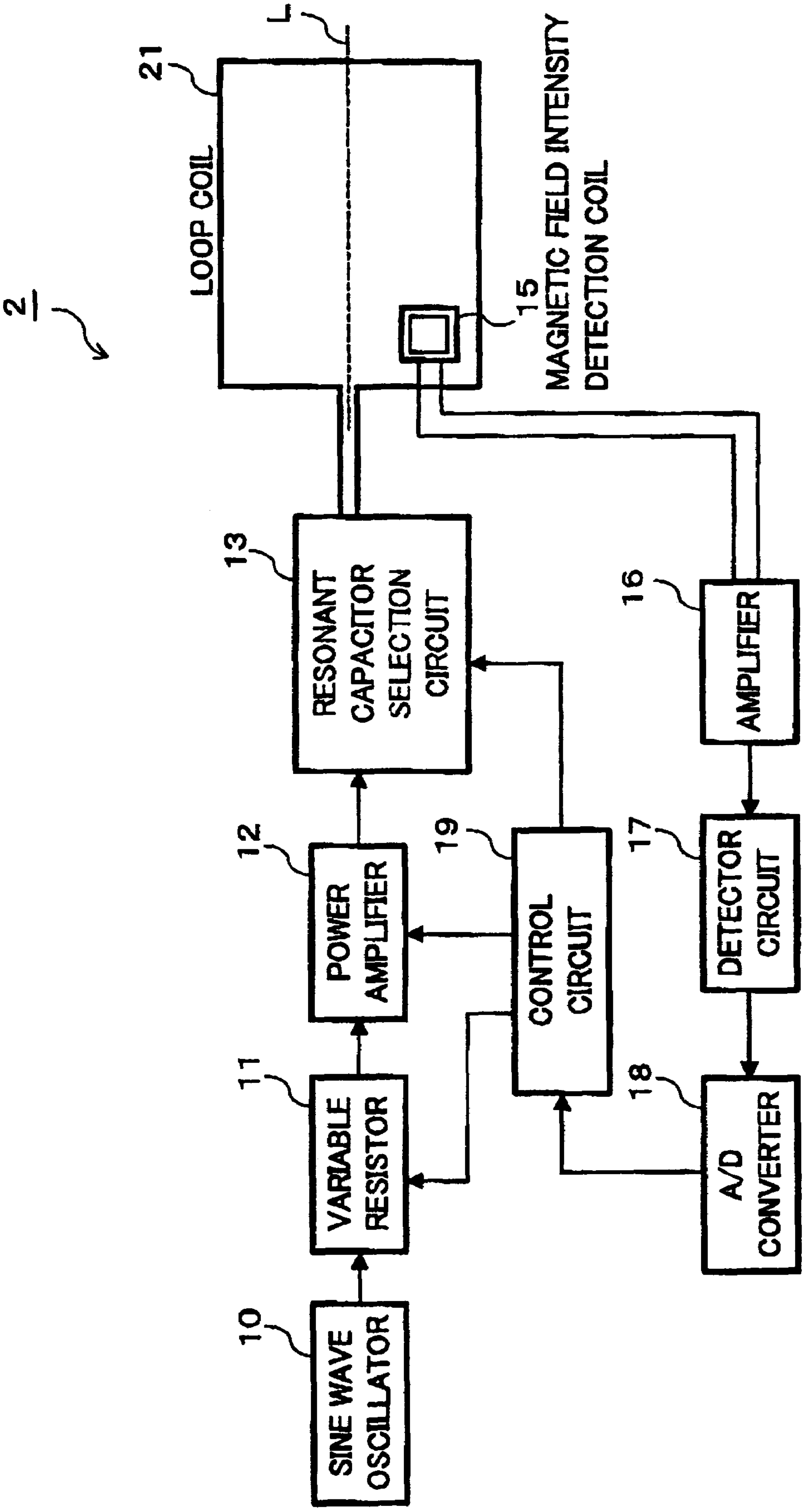
FIG. 5 is a schematic view illustrating one example of a structure of a magnetic field generating apparatus according to a second embodiment of the present invention.

FIG. 5 illustrates one example of a structure of a magnetic field generating apparatus 2 applied to a second embodiment of the present invention. The magnetic field generating apparatus 2 is also used in, for example, an athletic time measuring system that measures running time of each runner in a marathon race. Namely, the magnetic field generating apparatus 2 generates an electromagnetic field at time measuring points including a time measuring line L. Then, a magnetic field detection coil, which is included in a wireless IC tag held by the runner, detects the electromagnetic field generated by the magnetic field generating apparatus 2, thereby detecting arrival to the time measuring line L.

As illustrated in the figure, the magnetic field generating apparatus 2 includes a sine wave oscillator 10, a variable resistor 11, a power amplifier 12, a resonant capacitor selection circuit 13, a magnetic field intensity detection coil 15, an amplifier 16, a detector circuit 17, an A/D converter 18, a control circuit 19, and a loop coil 21.

Additionally, the structural components excepting the loop coil 21 are the same as those of the aforementioned magnetic field generating apparatus 1.

The loop coil 21 is a coil that is square formed, and is suitably placed on the running course where the runner runs.

Figure 6A:
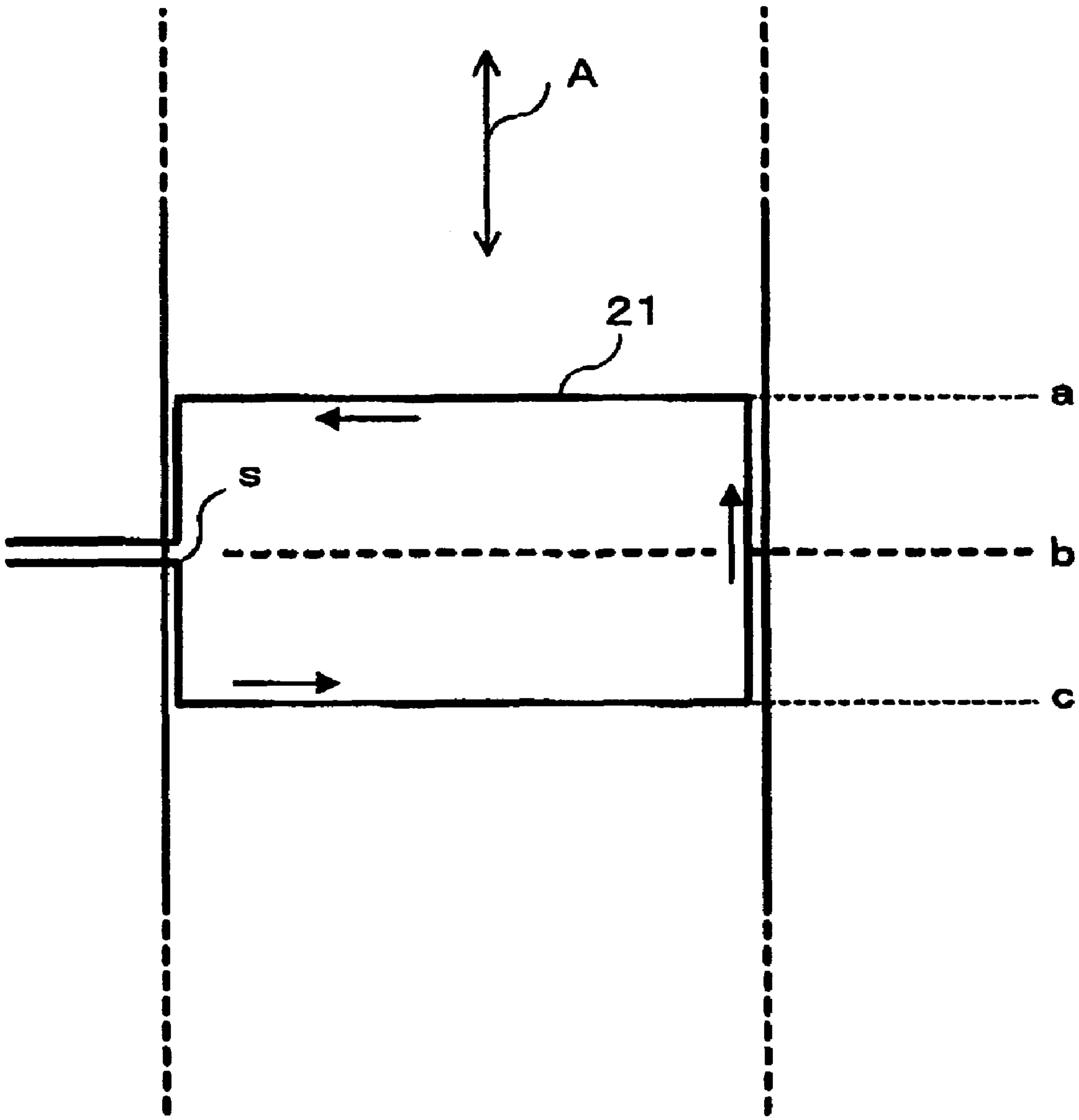
FIG. 6A is a schematic view illustrating one example of a loop coil provided on a running course.

For example, the loop coil 21 is substantially square (rectangular) formed as illustrated in FIG. 6A. Then, a feeding point s is formed on one side of the loop coil 21, so that current flows in the direction of an arrow from the feeding point s. Additionally, a straight line b, which is a center of the direction where the runner runs (the direction of an arrow A of FIG. 6A), is placed on the time measuring line L as a time measuring point.

Then, when a sine wave is supplied through the resonant capacitor selection circuit 13, the loop coil 21 generates an alternating electric and magnetic field on the coil. Specifically, the loop coil 21 generates an electromagnetic field as illustrated in FIG. 6B.

Similar to the aforementioned magnetic field generating apparatus 1, since the resonant capacitor selection circuit 13 connects the resonant capacitors with the same capacitance to both input terminals of the loop coil 21 in series, a symmetrical electromagnetic field is used in a state that the straight line b is used as a symmetry axis.

Figure 6B:
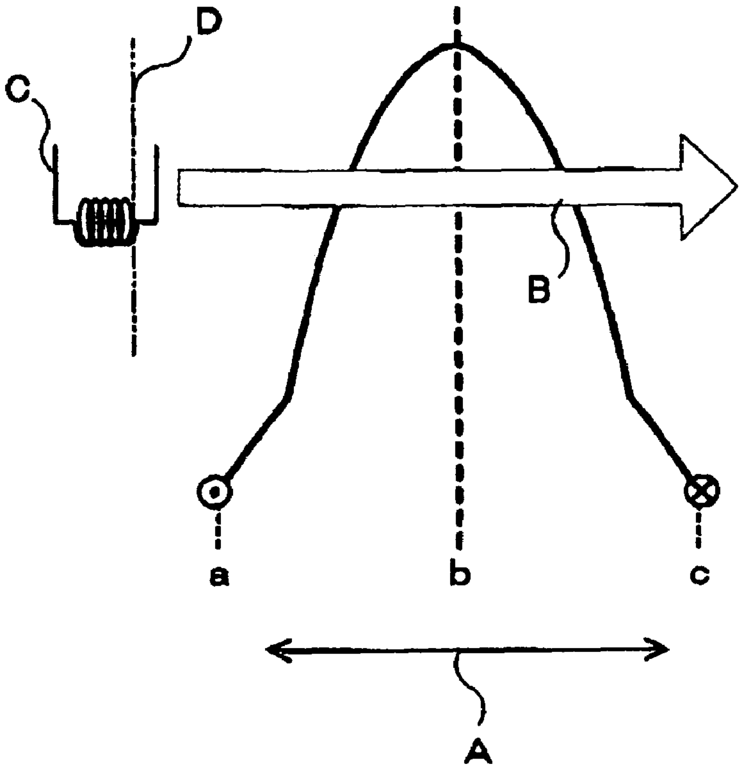
FIG. 6B is a schematic view explaining an electromagnetic field to be generated.
Figure 6C:
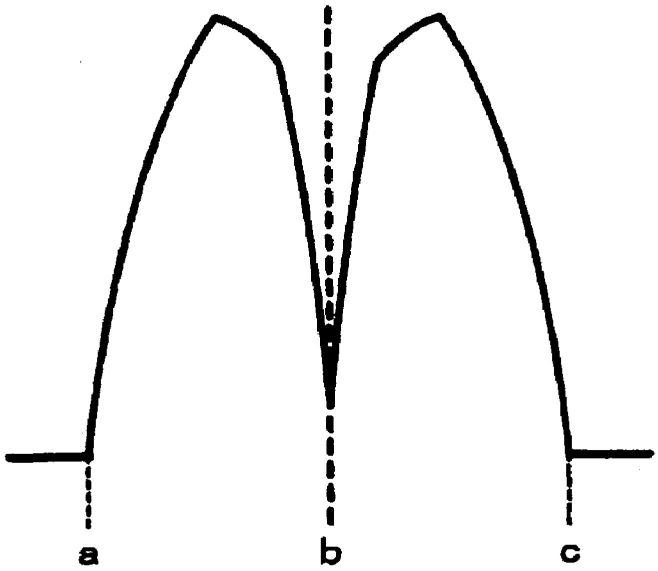
FIG. 6C is a schematic view explaining an intensity distribution of an electromagnetic field to be generated.

In such the electromagnetic field, an electromagnetic field detection coil C where a detection coil surface D shown in FIG. 6B is placed in a direction perpendicular to a running course surface (namely, the detecting direction is parallel to the running course) is moved in a direction of an arrow B, an electromagnetic field intensity distribution as illustrated in FIG. 6C is obtained. Namely, since the magnetic field detection coil C captures a magnetic flux, which is in the direction vertical to the running course, at the coil surface D, the electromagnetic field intensity distribution as illustrated in FIG. 6C where electromagnetic field intensity decreases at just the center is detected.

Accordingly, when the runner, who holds the magnetic field detection coil C, passes through the loop coil 21 along the direction of an arrow B, the magnetic field detection coil C can detect the time measuring line L (straight line b) as a trigger point of the electromagnetic field.

Additionally, for example, the magnetic field intensity detection coil 15 is placed at an inner side of the loop coil 21 and is on the same plane as the loop coil 21 (namely, on the running course), and detects intensity of the electromagnetic field generated by the loop coil 21.

Similar to the aforementioned magnetic field generating apparatus 1, the magnetic field generating apparatus 2 using such the square loop coil 21 also obtains the electromagnetic field signal detected by the magnetic field intensity detection coil 15 in a state that the electromagnetic field is generated on the loop coil 21. Then, the control circuit 19 controls the resonant capacitor selection circuit 13 based on the obtained electromagnetic field signal, and adjusts a maximum current to flow into the loop coil 21. In other words, the control circuit 19 on/off-controls the respective control switches SW of the resonant capacitor selection circuit 13, and selects a resonant capacitor with a suitable capacitance in such a way that the resonance point (for example, 125 kHz) reaches a maximum level.

Moreover, the control circuit 19 adjusts the variable resistor 11 in such a way to obtain a target electromagnetic field signal in a state that the resonant capacitor selection circuit 13 is controlled to make the maximum current flow into the loop coil 21. Namely, the control circuit 19 performs automatic gain control to obtain optimal electromagnetic field intensity on the loop coil 21.

Accordingly, the magnetic field generating apparatus 2 can generate the electromagnetic field with suitable intensity on the loop coil 21 for a relatively short period of time after mounting the loop coil 21. Thereafter, when load conditions at the location where the loop coil 21 is mounted are changed halfway or even when a resonance point is varied by the characteristic of the loop coil 21, the resonant capacitor selection circuit 13 and the variable resistor 11 are automatically adjusted, so that the electromagnetic field generated by the loop coil 21 is suitably maintained.

As a result, the magnetic field generating apparatus 2 of the present invention can suitably control the electromagnetic field to be generated.

(Another Embodiment)

The aforementioned first and second embodiments have explained the case in which intensity of the electromagnetic field excited by the loop coil 14 is detected by the electromagnetic field intensity detection coil 15. However, the present invention includes a magnetic field generating apparatus and magnetic field controlling method that can detect intensity of the electromagnetic field on the loop coil 14 by other mechanism.

Figure 7:
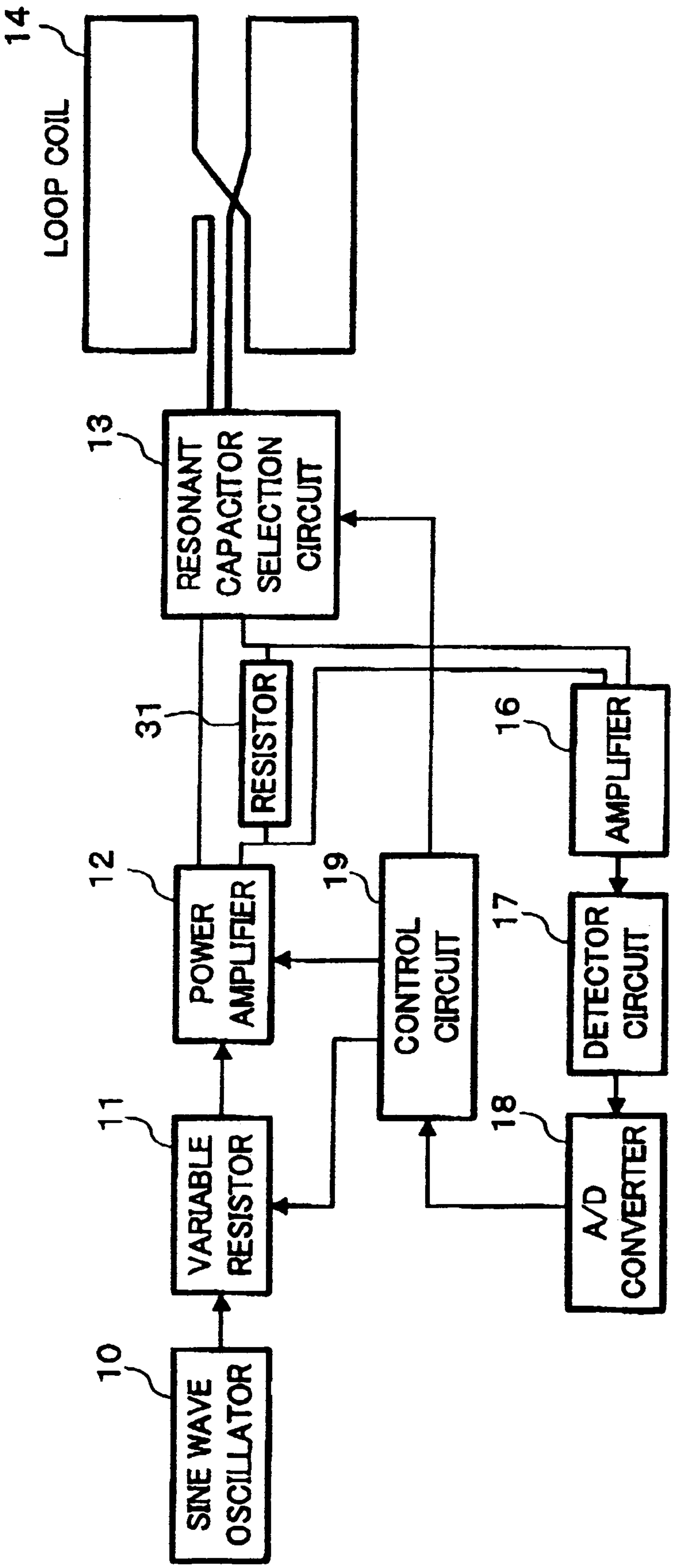
FIG. 7 is a schematic view illustrating one example of a structure of a magnetic field generating apparatus according to another embodiment of the present invention.
Figure 8A:
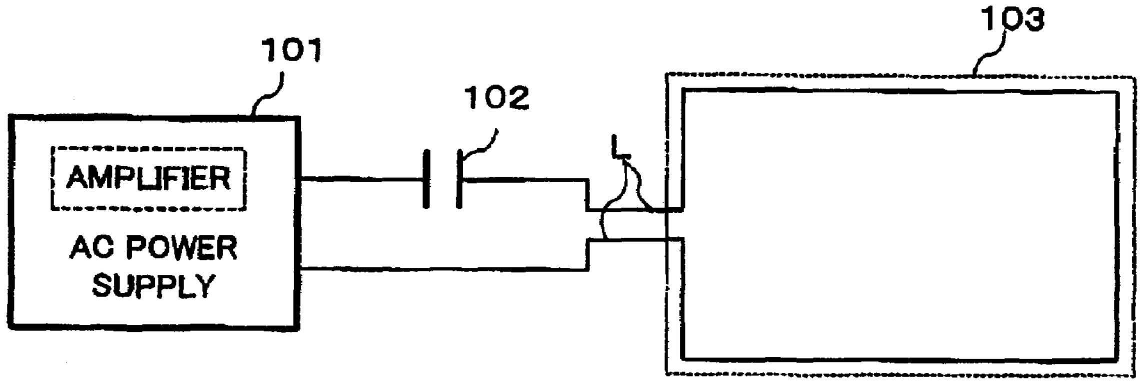
FIGS. 8A and 8B are schematic views each illustrating one example of a structure of a conventional magnetic field generating apparatus.
Figure 8B:
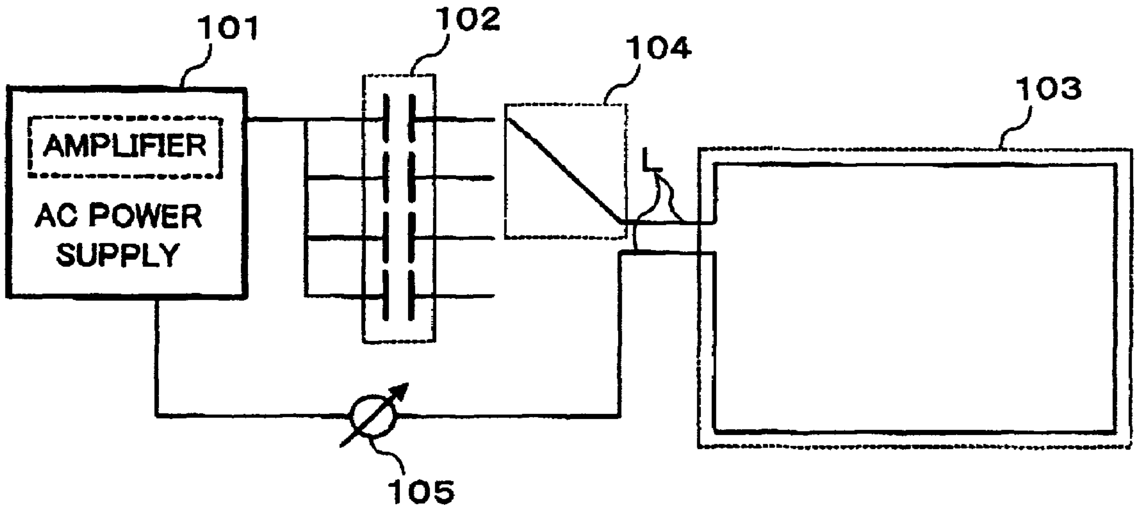

For example, as illustrated in FIG. 7, a resistor 31 is provided between the power amplifier 12 and the resonant capacitor selection circuit 13, and a current value is measured by voltage drops of both terminals so that intensity of the electromagnetic field on the loop coil 14 may be detected. Namely, the voltage drops of both terminals of the resistor 31 are supplied to the control circuit 19 by the amplifier 16 and the like and intensity of the electromagnetic field on the loop coil 14 is detected from the current value measured by the control circuit 19.

In this case, the control circuit 19 also adjusts the variable resistor 11 in such a way to obtain a target electromagnetic field signal in a state that the resonant capacitor selection circuit 13 is controlled to make the maximum current flow into the loop coil 14. As a result, the electromagnetic field generated by the loop coil 14 is suitably controlled.

The aforementioned first and second embodiments have explained the case in which the capacitance of the resonant capacitor is changed by the resonant capacitor selection circuit 13 including the multiple capacitors and the control switches corresponding to the respective capacitors. However, even in a case where the resonant capacitor and the capacitor changing section are implemented by the other structural components, this case is included in the magnetic field generating apparatus and magnetic field controlling method of the present invention.

Figure 10A:
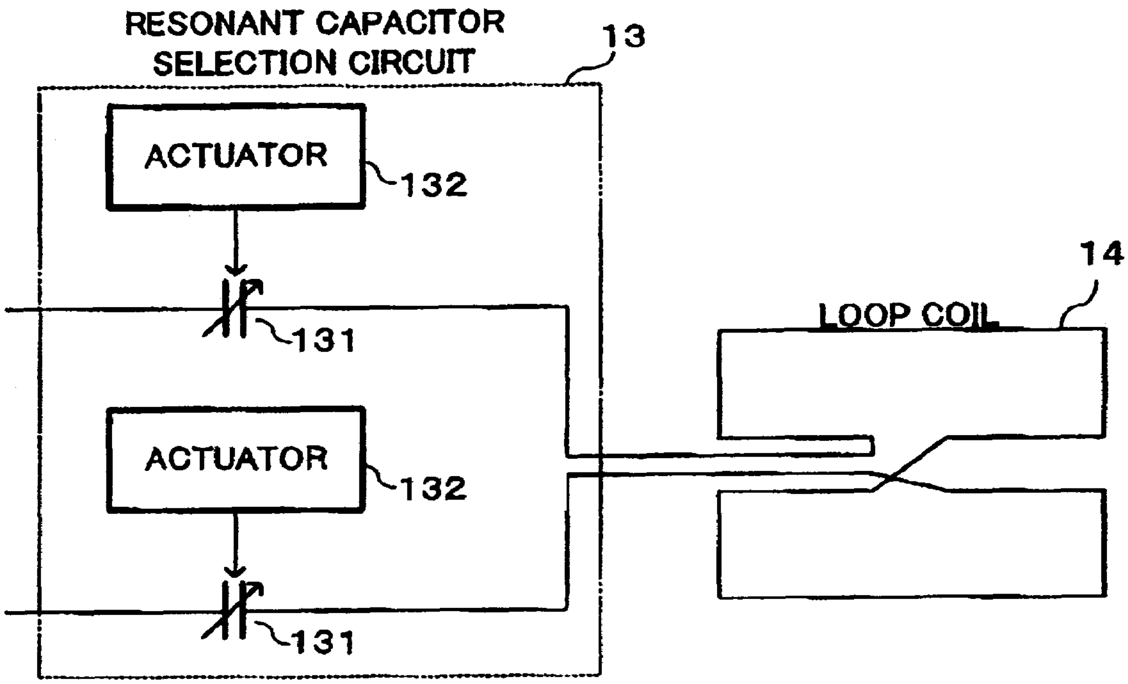
FIGS. 10A and 10B are schematic views each illustrating one example of a resonant capacitor selection circuit.

For example, as illustrated in FIG. 10A, the resonant capacitor selection circuit 13 may be implemented by a variable capacitance capacitor 131, which changes a capacity by a mechanical operation, and an actuator 132.

Figure 10B:
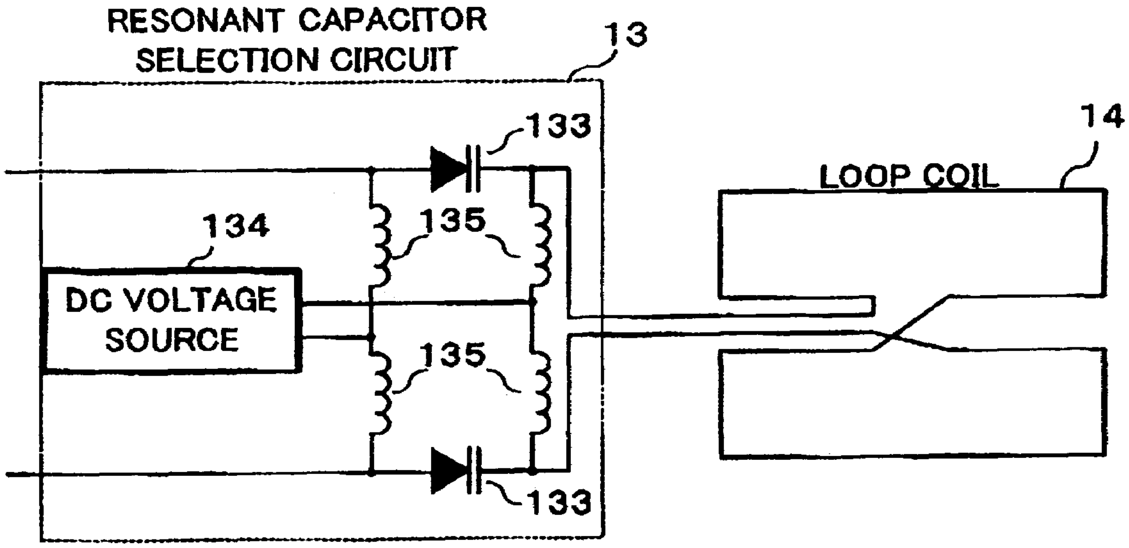

Furthermore, as illustrated in FIG. 10B, the resonant capacitor selection circuit 13 may be implemented by a variable capacitance diode 133 and a DC voltage source 134, which supplies a DC voltage that defines a capacitance value of the variable capacitance diode, and an inductor 135.

As explained above, according to the present invention, it is possible to suitably control the electromagnetic field to be generated.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2004-311747 filed on Oct. 27, 2004 and including specification, claims, drawings and summary. The disclosure of the above Japanese Patent Application is incorporated herein by reference in its entirety.

What is claimed is:

1. A magnetic field generating apparatus configured to be used in an athletic time measuring system, in which an electromagnetic field is generated, a magnetic field detection coil held by an athlete detects the generated electromagnetic field, and in which thereby the arrival, at a time measuring position, of a player is detected, the magnetic field generating apparatus generating at least one electromagnetic field so that a first intensity, a second intensity that is lower than the first intensity, and a third intensity that is higher than the second intensity, are provided along the direction of travel of an athlete, and the magnetic field generating apparatus comprising:

- a loop coil provided on a course and generating the electromagnetic field so that the measuring position is in a location of the second intensity;
- a resonant capacitor, having a variable capacitance, and being connected to said loop coil;
- a capacitance changing section that changes the capacitance of said resonant capacitor;
- a sine wave supplying section that supplies a sine wave current with a predetermined frequency to said loop coil through said resonant capacitor;
- an intensity detecting section that detects intensity of an electromagnetic field excited by said loop coil in a state that the sine wave current is supplied by said sine wave supplying section; and
- a control section that controls said capacitance changing section based on the intensity of the electromagnetic field detected by said intensity detecting section to change the capacitance of said resonant capacitor.

2. The magnetic field generating apparatus according to claim 1, further comprising an amplifying section that amplifies the sine wave current supplied from said sine wave supplying section by an arbitrary gain and supplies the amplified sine wave current to said loop coil through said resonant capacitor,

- wherein said control section controls the gain of said amplifying section in such a way to obtain an electromagnetic field with predetermined intensity on said loop coil in a state that said capacitance changing section is controlled so that a maximum current flows into said loop coil.

3. The magnetic field generating apparatus according to claim 1,

- wherein said resonant capacitor includes multiple capacitors connectable in series to two input terminals of said loop coil, respectively; and wherein said capacitance changing section selects one or more capacitors connected to said loop coil from said multiple capacitors.

4. The magnetic field generating apparatus according to claim 1, wherein said resonant capacitor includes a variable capacitance capacitor that changes the capacitance by a mechanical operation; and wherein said capacitance changing section includes an actuator that provides the mechanical operation to said variable capacitance capacitor based on control by said control section.

5. The magnetic field generating apparatus according to claim 1, wherein said resonant capacitor includes a variable capacitance diode; and said capacitance changing section includes a DC voltage supplying section that supplies a DC voltage, which defines a capacitance value of said variable capacitance diode.

6. The magnetic field generating apparatus according to claim 1, wherein said loop coil is formed in the shape of substantially a figure eight and excites an electromagnetic field with a predetermined intensity distribution on said loop coil according to the shape when the sine wave current is supplied; and overlapping portions of two coil portions comprising the shape of substantially a figure eight are placed on a time measurement line.

7. The magnetic field generating apparatus according to claim 1, wherein said loop coil is square formed and excites an electromagnetic field with a predetermined intensity distribution on said loop coil according to the shape when the sine wave current is supplied; and overlapping portions of the two loop coils are placed on a time measurement line.

8. The magnetic field generating apparatus according to claim 1, wherein said loop coil includes two square formed loop coils and excites an electromagnetic field with a predetermined intensity distribution on each loop coil according to the shape when the sine wave current is supplied.

9. The magnetic field generating apparatus according to claim 1, wherein said intensity detecting section detects intensity of an electromagnetic field excited by said loop coil by a magnetic field detection coil placed on the same plane of the inner side of said loop coil.

10. The magnetic field generating apparatus according to claim 2, wherein said intensity detecting section detects intensity of an electromagnetic field excited by said loop coil by measuring a potential difference between both ends of a resistor placed to connect said amplifying section to said capacitance changing section.

11. A magnetic field controlling method that controls an electromagnetic field to be generated on a loop coil placed on a course, comprising:

a capacitance changing step of changing a capacitance of a resonant capacitor when a sine wave current with a predetermined frequency is supplied to said loop coil through said resonant capacitor with a variable capacitance from a sine wave oscillator;

an intensity detecting step of detecting intensity of an electromagnetic field excited by a magnetic field detection coil held by an athlete, said loop coil in a state that said sine wave current is supplied through said resonant capacitor; and a controlling step of controlling said capacitance changing step based on intensity of the electromagnetic field detected in said intensity detecting step to change the capacitance of said resonant capacitor.

* * * * *